United States Patent
Hong et al.

(10) Patent No.: US 11,764,194 B2
(45) Date of Patent: Sep. 19, 2023

(54) MICRO-LIGHT-EMITTING DIODE DISPLAY APPARATUS AND METHOD OF MANUFACTURING THE SAME

(71) Applicant: SAMSUNG ELECTRONICS CO., LTD., Suwon-si (KR)

(72) Inventors: Seogwoo Hong, Yongin-si (KR); Junsik Hwang, Hwaseong-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 223 days.

(21) Appl. No.: 17/174,934

(22) Filed: Feb. 12, 2021

(65) Prior Publication Data
US 2022/0077120 A1 Mar. 10, 2022

(30) Foreign Application Priority Data
Sep. 4, 2020 (KR) .......................... 10-2020-0113203

(51) Int. Cl.
| | | |
|---|---|---|
| *H01L 25/075* | (2006.01) | |
| *H01L 33/50* | (2010.01) | |
| *H01L 27/12* | (2006.01) | |
| *H01L 33/62* | (2010.01) | |

(52) U.S. Cl.
CPC ...... *H01L 25/0753* (2013.01); *H01L 27/1214* (2013.01); *H01L 33/50* (2013.01); *H01L 33/62* (2013.01); *H01L 2933/0066* (2013.01)

(58) Field of Classification Search
CPC .... H01L 25/167; H01L 25/0753; H01L 33/62
See application file for complete search history.

(56) References Cited

U.S. PATENT DOCUMENTS

| | | | |
|---|---|---|---|
| 9,472,734 B1 * | 10/2016 | Chen ...................... | H01L 33/60 |
| 9,865,832 B2 | 1/2018 | Bibl et al. | |
| 11,004,836 B2 * | 5/2021 | Bibl ........................ | H01L 33/30 |
| 2011/0220928 A1 * | 9/2011 | Muramoto ............. | H01L 33/44 |
| | | | 257/E33.012 |

(Continued)

FOREIGN PATENT DOCUMENTS

| | | |
|---|---|---|
| CN | 107731863 A | 2/2018 |
| EP | 3 660 900 A | 6/2020 |

(Continued)

OTHER PUBLICATIONS

Communication dated Dec. 8, 2021 by the European Patent Office in counterpart Chinese Patent Application No. 21180285.5.

*Primary Examiner* — Andrew J Coughlin
(74) *Attorney, Agent, or Firm* — Sughrue Mion, PLLC

(57) ABSTRACT

The present disclosure provides a micro-light-emitting diode display apparatus and a method of manufacturing the same. Provided is a micro-light-emitting diode (LED) display apparatus including a plurality of pixels, the micro-LED display apparatus including a driving circuit substrate, a first electrode provided on the driving circuit substrate, one or more micro-light-emitting diodes (LEDs) provided on the first electrode, an insulating layer provided on the one or more micro-LEDs, a via pattern provided in the insulating layer, electrical contacts provided in the via pattern, and a second electrode provided on the electrical contacts, wherein the via pattern exposes a portion of the one or more micro-LEDs.

22 Claims, 19 Drawing Sheets

(56) References Cited

U.S. PATENT DOCUMENTS

| | | | |
|---|---|---|---|
| 2011/0297989 A1* | 12/2011 | Murai | H01L 33/10 |
| | | | 257/98 |
| 2012/0256814 A1* | 10/2012 | Ootorii | G09G 3/3208 |
| | | | 345/82 |
| 2017/0062397 A1* | 3/2017 | Park | H01L 27/1248 |
| 2019/0181060 A1 | 6/2019 | Pappas et al. | |
| 2019/0296184 A1 | 9/2019 | Ahmed et al. | |
| 2019/0393389 A1* | 12/2019 | Chen | H01L 33/58 |
| 2020/0013975 A1 | 1/2020 | Bibl et al. | |
| 2020/0212102 A1* | 7/2020 | Park | H01L 25/0753 |
| 2020/0274039 A1 | 8/2020 | Chen et al. | |
| 2021/0142716 A1 | 5/2021 | Robin et al. | |
| 2022/0013400 A1 | 1/2022 | Hwang et al. | |

FOREIGN PATENT DOCUMENTS

| | | |
|---|---|---|
| JP | 4450067 B2 | 4/2010 |
| JP | 6159477 B2 | 7/2017 |
| KR | 10-2020-0026285 A | 3/2020 |

\* cited by examiner

MICRO-LIGHT-EMITTING DIODE DISPLAY APPARATUS AND METHOD OF MANUFACTURING THE SAME

CROSS-REFERENCE TO RELATED APPLICATION

This application claims priority to Korean Patent Application No. 10-2020-0113203, filed on Sep. 4, 2020, in the Korean Intellectual Property Office, the disclosure of which is incorporated by reference herein in its entirety.

BACKGROUND

1. Field

Example embodiments of the present disclosure relate to a display apparatus including a micro-light-emitting diode (LED) and a method of manufacturing the display apparatus including the micro-LED.

2. Description of the Related Art

Light-emitting diodes (LEDs) have benefits such as low power consumption and environment-friendly characteristics. Because of these benefits, industrial demand for the LEDs has increased. The LEDs are applied not only to illumination devices or liquid crystal display (LCD) backlight units, but also to LED display apparatuses. In other words, display apparatuses using micro-unit LED chips have been developed. When manufacturing a micro-LED display apparatus, it is necessary to transfer a micro-LED onto a substrate. As a method of transferring the micro-LED, a pick and place method is frequently used. However, according to this method, a yield rate decreases when a size of the micro-LED decreases and a size of a display increases.

Also, with the increased number of micro-LEDs, the need for high-speed transfer and a reduced repair rate has increased.

SUMMARY

One or more example embodiments provide a display apparatus capable of reducing a repair rate.

One or more example embodiments also provide a method of manufacturing a display apparatus capable of reducing a repair rate.

Additional aspects will be set forth in part in the description which follows and, in part, will be apparent from the description, or may be learned by practice of example embodiments of the disclosure.

According to an aspect of an example embodiment, there is provided a micro-light-emitting diode (LED) display apparatus including a plurality of pixels, the micro-LED display apparatus including a driving circuit substrate, a first electrode provided on the driving circuit substrate, one or more micro-light-emitting diodes (LEDs) provided on the first electrode, an insulating layer provided on the one or more micro-LEDs, a via pattern provided in the insulating layer, electrical contacts provided in the via pattern, and a second electrode provided on the electrical contacts, wherein the via pattern exposes a portion of the one or more micro-LEDs.

A thickness of the insulating layer may be greater than a thickness of the one or more micro-LEDs.

A thickness of each of the electrical contacts may correspond to a distance between an upper surface of the insulating layer and an upper surface of the one or more micro-LEDs.

A pitch of the electrical contacts may be less than a width of each of the one or more micro-LEDs.

Each of the plurality of pixels may include a plurality of sub-pixels, and the via pattern may be provided on each of the plurality of sub-pixels.

Each of the plurality of pixels may include a plurality of sub-pixels, and the one or more micro-LEDs may be provided on each of the plurality of the sub-pixels.

The one or more micro-LEDs may be irregularly provided.

The one or more micro-LEDs may be connected between the first electrode and the second electrode.

The electrical contacts may be provided in dotted patterns, stripe patterns, grid patterns, or concentric-circular patterns.

The electrical contacts and the second electrode may have a same material.

The micro-LED display apparatus may further include an electrode pad provided between the one or more micro-LEDs and the first electrode.

The micro-LED display apparatus may further include a color conversion layer provided on the second electrode, the color conversion layer being configured to convert a color of light emitted from the one or more micro-LEDs.

According to another aspect of an example embodiment, there is provided a method of manufacturing a micro-light emitting diode (LED) display apparatus including a plurality of pixels, the method including providing a first electrode on a driving circuit substrate, providing one or more micro-light-emitting diodes (LEDs) to the driving circuit substrate such that a first electrode pad of the one or more micro-LEDs contacts the first electrode, providing an insulating layer on the one or more micro-LEDs, providing, in the insulating layer, a via pattern exposing a portion of the one or more micro-LEDs, providing electrical contacts in the via pattern, and providing a second electrode on the electrical contacts and the insulating layer.

A thickness of the insulating layer may be greater than a thickness of the one or more micro-LEDs.

A thickness of each of the electrical contacts may correspond to a distance between an upper surface of the insulating layer and an upper surface of the one or more micro-LEDs.

A pitch of the electrical contacts may be less than a width of each of the one or more micro-LEDs.

Each of the plurality of pixels may include a plurality of sub-pixels, and the via pattern may be provided on each of the plurality of sub-pixels.

Each of the plurality of pixels may include a plurality of sub-pixels, and the one or more micro-LEDs may be provided on each of the plurality of sub-pixels.

The one or more micro-LEDs may be irregularly provided.

The one or more micro-LEDs may be connected between the first electrode and the second electrode.

The electrical contacts may be provided in dotted patterns, stripe patterns, grid patterns, or concentric-circular patterns.

A depth of the via pattern may be selectively adjusted based on adjusting an etch duration time or based on a resolution and a critical dimension of a photosensitive material.

According to another aspect of an example embodiment, there is provided a micro-light-emitting diode (LED) display apparatus including a plurality of pixels, the micro-LED display apparatus including a driving circuit substrate, a first electrode provided on the driving circuit substrate, one or more micro-light-emitting diodes (LEDs) provided on the first electrode, an insulating layer provided on the one or more micro-LEDs, a via pattern provided in the insulating layer, electrical contacts provided in the via pattern, and a second electrode provided on the electrical contacts, wherein the electrical contacts are spaced apart from the first electrode, and wherein a thickness of each of the electrical contacts corresponds to a distance between an upper surface of the insulating layer and an upper surface of the one or more micro-LEDs

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1:
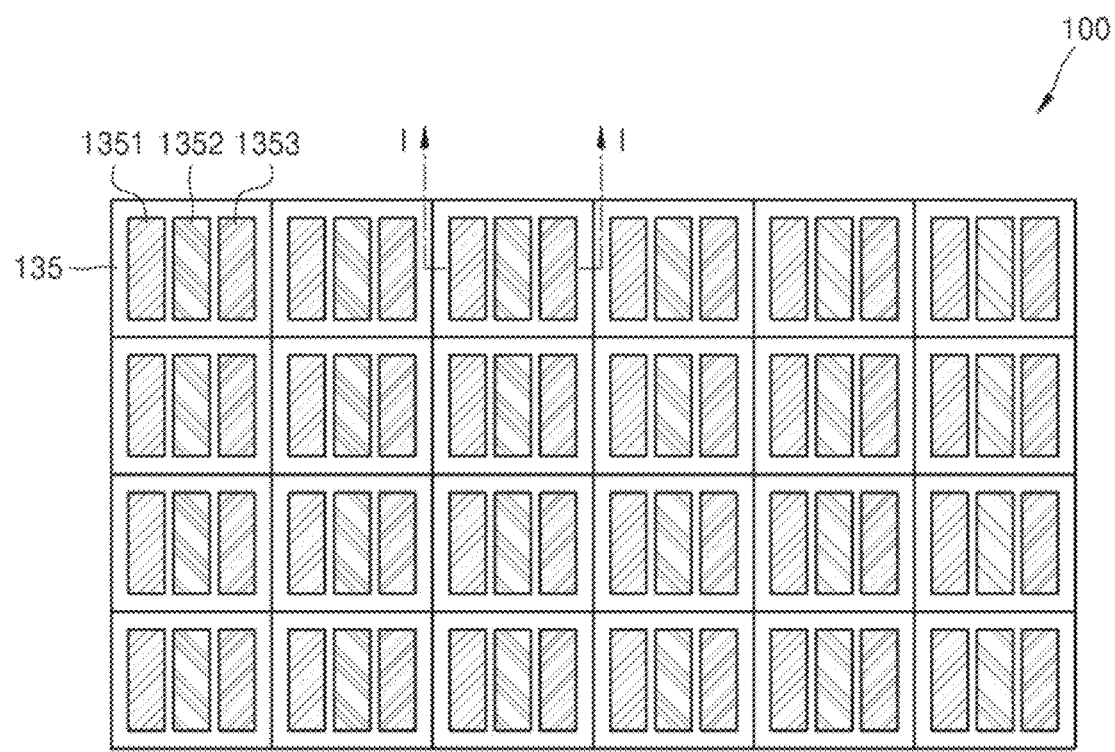
FIG. 1 is a schematic pixel diagram of a micro-light-emitting diode (LED) display apparatus according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a micro-light-emitting diode (LED) display apparatus and a method of manufacturing the micro-LED display apparatus according to various example embodiments will be described in detail with reference to the accompanying drawings. In the drawings, the same reference numerals denote the same elements and the sizes of elements may be exaggerated for clarity and convenience of explanation. Although the terms first, second, etc. may be used herein to describe various elements, these terms do not limit the components. These terms are only used to distinguish one element from another.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements. A size of each element in the drawings may be exaggerated for clarity and convenience of explanation. Also, when a certain material layer is described as being on a substrate or another layer, the material layer may be on the substrate or the other layer by directly contacting the same, or a third layer may be arranged between the material layer, and the substrate or the other layer. Also, a material included in each of layers in embodiments to be described below is only an example and other materials may also be used.

Also, the terms such as "unit," "module," or the like used in the specification indicate an unit, which processes at least one function or motion, and the unit may be implemented by hardware or software, or by a combination of hardware and software.

Particular executions described in the example embodiments are examples and do not limit the technical scope by any means. For the sake of brevity, conventional electronics, control systems, software development and other functional aspects of the systems may not be described. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The term "the" and other equivalent determiners may correspond to a singular referent or a plural referent.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are not defined in the scope of the claims.

FIG. 1 is a plan view of a micro-light-emitting diode (LED) display apparatus according to an example embodiment.

Referring to FIG. 1, the micro-LED display apparatus 100 may include a plurality of pixels 135. The plurality of pixels 135 may be arranged in the form of a two-dimensional matrix. Each of the plurality of pixels 135 may include a plurality of sub-pixels 1351, 1352, and 1353.

Each of the pixels 135 may indicate a basic unit for displaying a color in the micro-LED display apparatus 100. For example, one pixel 135 may emit first color light, second color light, and third color light and may display color light via the first through third color lights. For example, the first color light may include red light, the second color light may include green light, and the third color light may include blue light. However, the color lights are not limited thereto. Each of the pixels 135 may include the plurality of sub-pixels emitting each of the color lights. For example, the pixel 135 may include a first sub-pixel 1351 emitting the first color light, a second sub-pixel 1352 emitting the second color light, and a third sub-pixel 1353 emitting the third color light. Each of the first sub-pixel 1351, the second sub-pixel 1352, and the third sub-pixel 1353 may be separately electrically driven.

Figure 2:
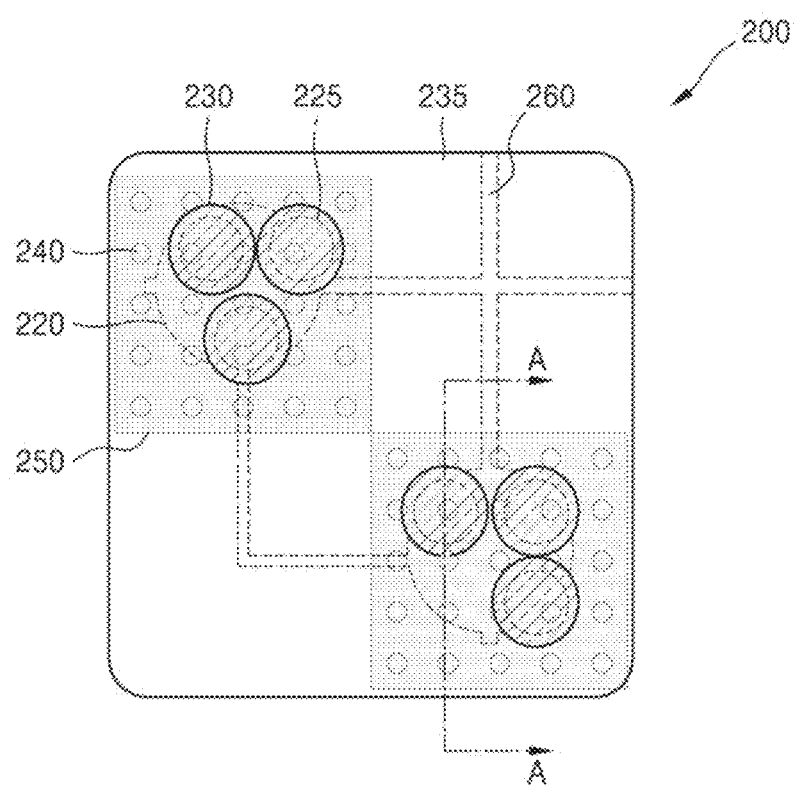
FIG. 2 is a plan view of a micro-LED display apparatus according to an example embodiment.
Figure 3A:
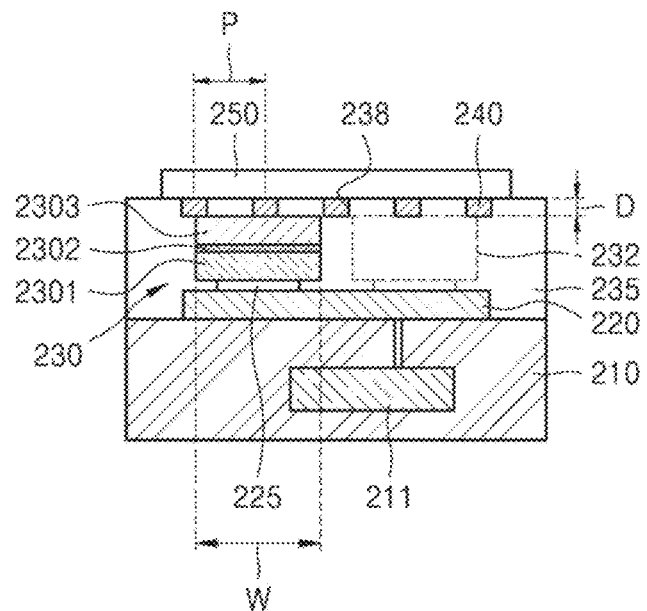
FIG. 3A is a cross-sectional view of the micro-LED display apparatus of FIG. 2, taken along line A-A.

FIG. 2 is a plan view of a micro-LED display apparatus 200 according to an example embodiment, and FIG. 3A is a cross-sectional view of the micro-LED display apparatus 200 of FIG. 2, taken along line A-A. FIG. 2 illustrates one sub-pixel of the micro-LED display apparatus 200 according to an example embodiment.

Referring to FIGS. 2 and 3A, the micro-LED display apparatus 200 may include a driving circuit substrate 210, a first electrode 220 formed on the driving circuit substrate 210, at least one micro-LED 230 formed on the first electrode 220, an insulating layer 235 formed to cover the at least one micro-LED 230, and a second electrode 250 formed on the insulating layer 235.

The driving circuit substrate 210 may include a driving circuit 211 configured to drive the micro-LED 230. The driving circuit 211 may include, for example, at least one transistor and at least one capacitor. The driving circuit 211 may include, for example, a switching transistor, a driving transistor, and a capacitor. However, the driving circuit 211 is not limited thereto. The driving circuit 211 may include one transistor and one capacitor. The driving circuit substrate 210 may include, for example, a complementary metal-oxide-semiconductor (CMOS) backplane. However, the driving circuit substrate 210 is not limited thereto.

The first electrode 220 may include, for example, a p-type electrode.

The micro-LED 230 may include, for example, a p-type semiconductor layer 2301, an active layer 2302, and an n-type semiconductor layer 2303. The p-type semiconductor layer 2301 may include a p-type GaN layer, and the n-type semiconductor layer 2303 may include, for example, an n-type GaN layer. The active layer 2302 may include, for example, a quantum-well structure or a multi-quantum-well structure. However, the micro-LED 230 is not limited thereto.

An electrode pad 225 may further be formed between the first electrode 220 and the micro-LED 230.

The insulating layer 235 may be formed to cover the micro-LED 230. The insulating layer 235 may have a greater thickness than the micro-LED 230. The insulating layer 235 may include an inorganic insulating layer and/or an organic insulating layer. For example, the inorganic insulating layer may include at least one of silicon oxide ($SiO_2$), aluminum oxide ($Al_2O_3$), hafnium oxide ($HfO_2$), and silicon nitride ($Si_3N_4$), and the organic insulating layer may include at least one of acrylic resins, polystyrene, polymethylmethacrylate (PMMA), polyacrylonitrile (PAN), siloxane series resins, and epoxy resins. A via pattern 238 may be formed in the insulating layer 235. The via pattern 238 may have a depth D to expose the micro-LED 230. For example, the via pattern 238 may have the depth D corresponding to a difference between a height of the insulating layer 235 and a height of the micro-LED 230. For example, the via pattern 238 may have the depth D corresponding to a distance between an upper surface of the insulating layer 235 and an upper surface of the n-type semiconductor layer 2303 of the micro-LED 230. The via pattern 238 may have various shapes. For example, the via pattern 238 may include a plurality of grooves arranged in the insulating layer 235 at a predetermined interval. Also, electrical contacts 240 may be provided in the via pattern 238. The electrical contact 240 may include a conductive material. The electrical contact 240 may have a structure which is defined by the via pattern 238. The via pattern 238 may have a pitch P that is less than a width W of the micro-LED 230. Also, the electrical contact 240 may have the pitch P that is less than the width W of the micro-LED 230. The electrical contacts 240 may be arranged at a regular pitch. However, the electrical contacts 240 may also be irregularly arranged. When the electrical contacts 240 are irregularly arranged, a maximum distance between adjacent electrical contacts 240 may be less than the width W of the micro-LED 230. FIG. 2 illustrates an example in which the electrical contacts 240 are arranged as dotted patterns.

The micro-LED 230 may have, for example, the width W, which is greater than about 0 and equal to or less than about 200 μm. The micro-LED 230 may have, for example, the width W, which is greater than about 0 and equal to or less than about 100 μm. Alternatively, the micro-LED 230 may have, for example, the width W, which is greater than about 0 and equal to or less than about 1 μm. Here, the width W of the micro-LED 230 may be a maximum cross-sectional width of the micro-LED 230. Here, the cross-sectional direction may be a direction perpendicular to a direction in which light is emitted.

When the electrical contacts 240 are arranged as described above, the micro-LEDs 230 may always contact the electrical contacts 240, even when the micro-LEDs 230 are irregularly arranged in a sub-pixel at an irregular interval. Also, when the micro-LEDs are transferred, there may be cases in which the micro-LEDs are not provided or missing. In FIG. 3A, a portion 232 may be an area where a micro-LED is not provided in the sub-pixel. According to the example embodiment, the electrical contact 240 has the thickness D corresponding to the difference between the height of the micro-LED 230 and the height of the insulating layer 235, and thus, a short-circuit may be prevented due to a step height, even when the micro-LED 230 is not provided. Thus, even when the micro-LED 230 is not provided, malfunctioning of the micro-LED display apparatus 200 may be prevented. Also, the plurality of micro-LEDs 230 are provided in the sub-pixel, and thus, a repair operation may not be needed even when one or more of the micro-LEDs 230 is not provided.

The via pattern 238 may be provided for each sub-pixel. Alternatively, each sub-pixel may include a plurality of via patterns 238.

The second electrode 250 may be coupled to the electrical contacts 240. The second electrode 250 may be coupled to the electrical contacts 240 such that the second electrode 250 contacts all of the electrical contacts 240. The electrical contacts 240 and the second electrode 250 may include different materials from each other. Alternatively, the electrical contacts 240 and the second electrode 250 may include the same material as each other.

In the micro-LED display apparatus 200 according to an example embodiment, one sub-pixel may include a plurality of the first electrodes 220, and the plurality of micro-LEDs 230 may be arranged in each of the plurality of first electrodes 220. Also, the second electrode 250 may be provided to correspond to the first electrode 220. However, the second electrode 250 is not limited thereto. The second electrode 250 may be provided to entirely correspond to one sub-pixel.

According to the example embodiment, the micro-LED 230 may emit different color light for each sub-pixel. In this case, a color filter configured to filter the color light from the micro-LED 230 may further be provided. However, the micro-LED 230 may radiate the same color light for each sub-pixel.

Figure 3B:
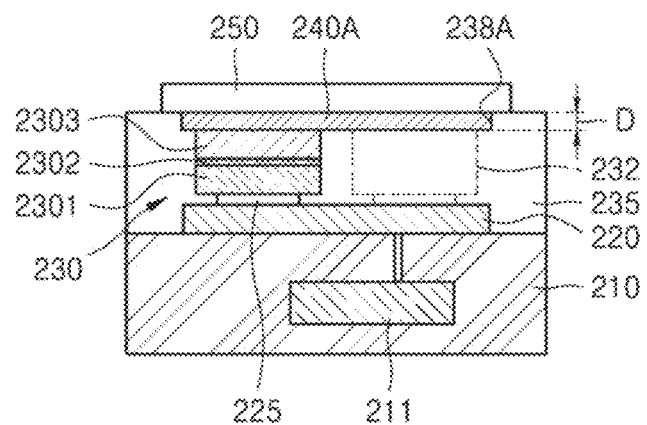
FIG. 3B is a cross-sectional view of a micro-LED display apparatus according to another example embodiment.

FIG. 3B illustrates an example in which a via pattern 238A includes one groove. In FIG. 3B, the components indicated by using the same reference numerals as FIG. 3A have substantially the same structures and configurations as FIG. 3A, and thus, their detailed descriptions will be omitted here.

FIG. 3B illustrates the example in which the via pattern 238A includes one groove that is configured to cover the micro-LED 230 provided in one sub-pixel. An electrical contact 240A may be formed in the via pattern 238A. The electrical contact 240A may include a conductive material. The via pattern 238A may have a depth D corresponding to a difference between a height of the insulating layer 235 and a height of the micro-LED 230. In this case, the via pattern 238A may cover most portions of the sub-pixel, and thus, wherever the micro-LED 230 is located, the electrical contact 240A and the micro-LED 230 may contact each other.

Figure 4:
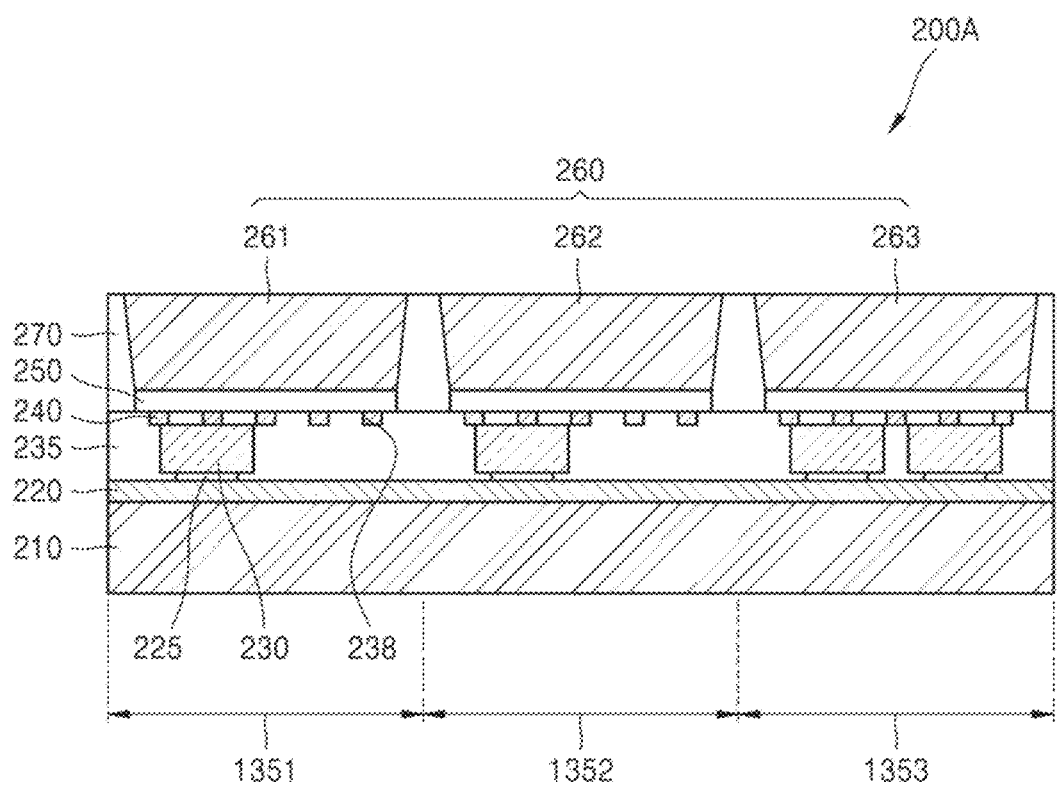
FIG. 4 is a cross-sectional view of a micro-LED display apparatus according to another example embodiment.

FIG. 4 illustrates an example in which the micro-LED 230 radiates the same color light for each sub-pixel.

FIG. 4 is a cross-sectional view of a micro-LED display apparatus 200A corresponding to the micro-LED display apparatus 200 of FIG. 1, taken along line I-I. The micro-LED display apparatus 200A may include a first sub-pixel 1351, a second sub-pixel 1352, and a third sub-pixel 1353. Here, the components indicated by using the same reference numerals as FIGS. 3A and 3B have substantially the same structures and configurations as FIGS. 3A and 3B, and thus, their detailed descriptions will be omitted here.

The micro-LED display apparatus 200A may further include, for example, partition walls 270 on the insulating layer 235, and a color conversion layer 260 between the partition walls 270. The partition walls 270 may be arranged at a predetermined interval. The color conversion layer 260 may be configured to convert a color of the light emitted from the micro-LED 230. The micro-LED 230 may emit first color light, for example, blue light. However, embodiments are not limited thereto. The micro-LED 230 may emit light of other wavelengths to excite the color conversion layer 260.

The color conversion layer 260 may include a first color conversion layer 261 configured to transmit light from the micro-LED 230, a second color conversion layer 262 configured to convert light from the micro-LED 230 into second color light, and a third color conversion layer 263 configured to convert light from the micro-LED 230 into third color light. The second color light may include, for example, green light, and the third color light may include, for example, red light.

The first color conversion layer 261 may include, for example, resins through which the light from the micro-LED 230 is transmitted. The second color conversion layer 262 may emit the green light using the blue light emitted from the micro-LED 230. The second color conversion layer 262 may include quantum dots (QD) of predetermined sizes, which are excited by the blue light and emit the green light. The QDs may have a core-shell structure having a core unit and a shell unit, or may have a particle structure having no shell. The core-shell structure may include a single-shell structure or a multi-shell structure. The multi-shell structure may include, for example, a double-shell structure.

The QDs may include, for example, at least one of groups II-VI-based semiconductors, groups III-V-based semiconductors, groups IV-VI-based semiconductors, groups IV-based semiconductors, and a graphene QD. The QDs may include, for example, at least one of cadmium (Cd), selenium (Se), zinc (Zn), sulfur (S), and indium phosphide (InP), but is not limited thereto. Each QD may have a diameter that is equal to or less than about dozens of nms. For example, each QD may have a diameter that is equal to or less than about 10 nm.

Alternatively, the second color conversion layer 262 may include a phosphor excited by the blue light emitted from the micro-LED 230 and emitting the green light.

The third color conversion layer 263 may emit the red light by changing the blue light emitted from the micro-LED 230 into the red light. The third color conversion layer 263 may include QDs of predetermined sizes, which are excited by the blue light and emit the red light. Alternatively, the third color conversion layer 263 may include a phosphor excited by the blue light emitted from the micro-LED 230 and emitting the red light.

FIGS. 5 through 8 are enlarged views of various examples in which micro-LEDs 315, 325, 335, and 345 are arranged in a region corresponding to one sub-pixel.

Figure 5:
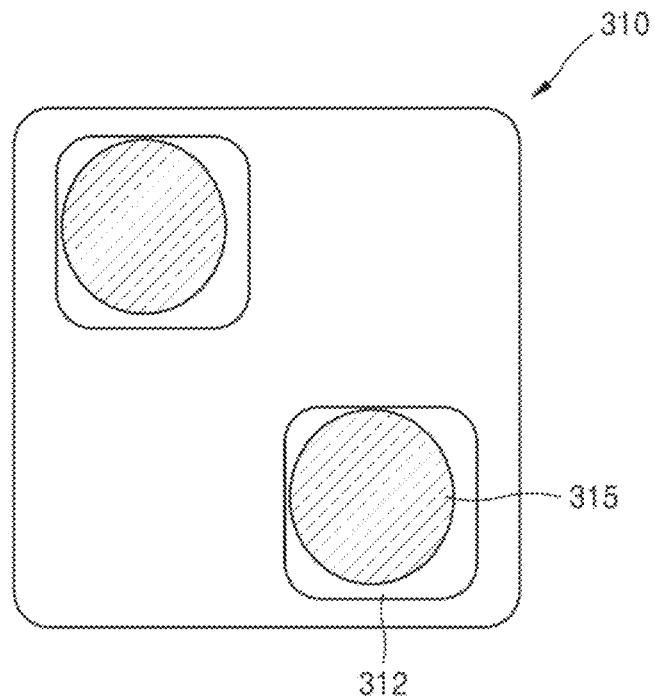
FIGS. 5, 6, 7, and 8 are diagrams of examples of various layout structures with respect to an electrode and a micro-LED of a micro-LED display apparatus according to example embodiments.

Referring to FIG. 5, two first electrodes 312 may be provided in a region 310 corresponding to a sub-pixel, and the micro-LED 315 may be provided in each of the two first electrodes 312. The micro-LED 315 may have, for example, a circular cross-section. However, the micro-LED 315 is not limited thereto, and may have cross-sections of various shapes, such as a quadrangular cross-section, a pentagonal cross-section, etc. The micro-LED 315 may have, for example, a vertical chip structure.

According to the example embodiment, the two first electrodes 312 may be arranged in a diagonal direction in the region 310. However, the location of the two first electrodes 312 is not limited thereto and may be variously modified. The arrangement of the first electrodes 312 may have a corresponding relationship with a transferring location of the micro-LED 315.

Figure 6:
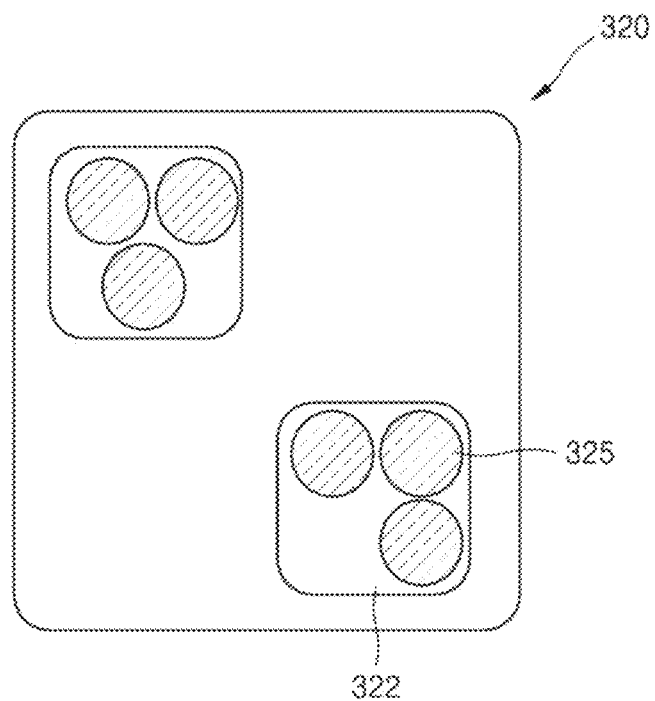

Referring to FIG. 6, two first electrodes 322 may be provided in a region 320 corresponding to a sub-pixel, and a plurality of micro-LEDs 325 may be provided in each of the two first electrodes 322. Each of the two first electrodes 322 may have a size to accommodate the plurality of micro-LEDs 325. Here, the two first electrodes 322 may be arranged in a diagonal direction in the region 320. However, the location of the two first electrodes 322 is not limited thereto and may be variously modified.

Figure 7:
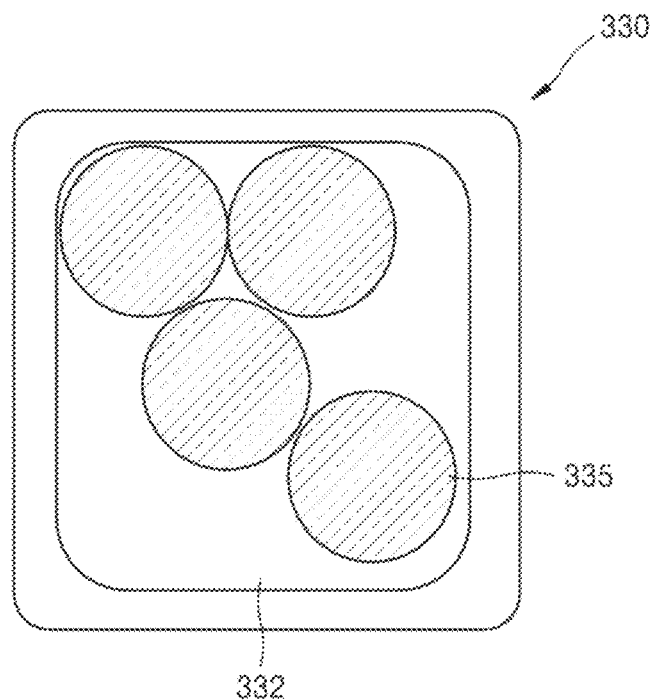

Referring to FIG. 7, one first electrode 332 may be provided in a region 330 corresponding to a sub-pixel, and a plurality of micro-LEDs 335 may be provided in the first electrode 332.

Figure 8:
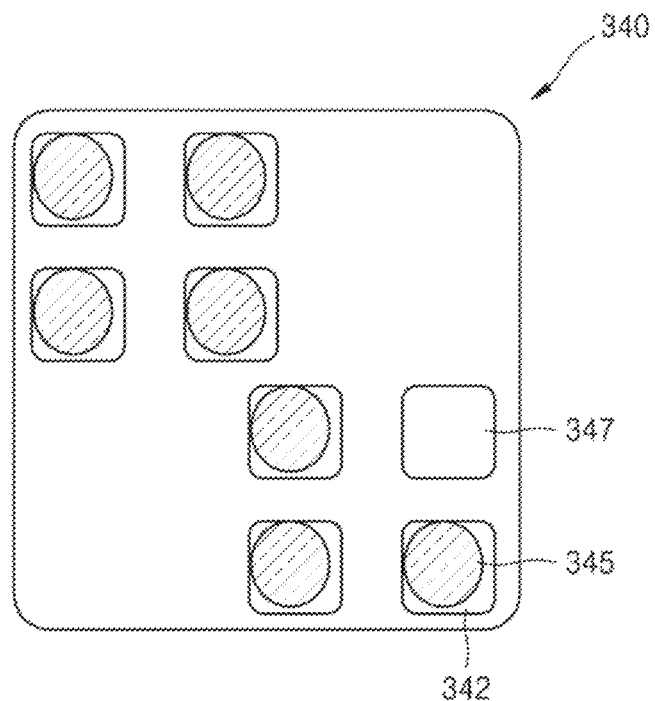

Referring to FIG. 8, eight first electrodes 342 may be provided in a region 340 corresponding to a sub-pixel. A micro-LED 345 may be provided in each of the eight first electrodes 342. When there are the plurality of first electrodes 342 in the region 340 corresponding to the sub-pixel as described above, even when the micro-LEDs of one or more of the plurality of first electrodes 342 are not provided, the pixel may operate normally. Thus, a pixel defect rate may be decreased, and a repair operation may be reduced. A portion 347 indicates an area corresponding to a missing micro-LED.

FIGS. 9 through 12 illustrate examples of various patterns of the electrical contacts 240 and 240A described with reference to FIGS. 2, 3A and 3B.

Figure 9:
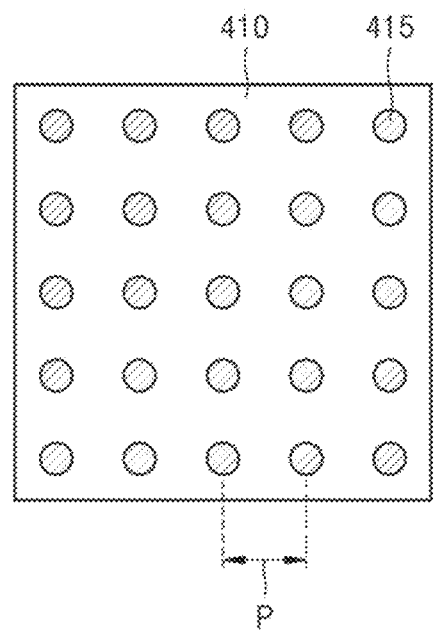
FIGS. 9, 10, 11, and 12 are diagrams of examples of various pattern structures of an electrical contact of a micro-LED display apparatus according to example embodiments.

Referring to FIG. 9, an electrical contact 415 may include dotted patterns connected to a second electrode 410. A pitch P of the dotted patterns may be less than the width W of the micro-LED 230 (see FIG. 3A). When the dotted patterns are irregularly arranged, a maximum pitch P between the dotted patterns may be less than the width W of the micro-LED 230.

Figure 10:
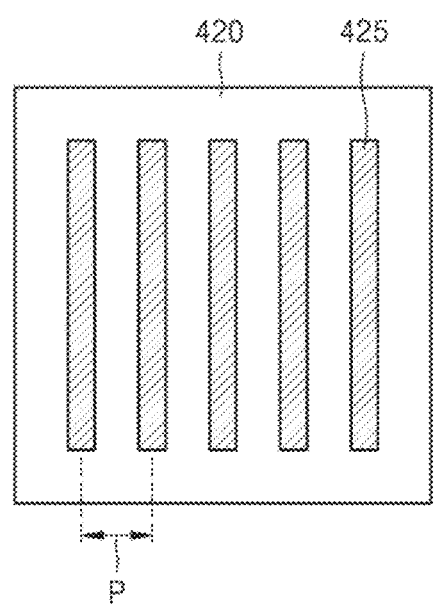
Figure 11:
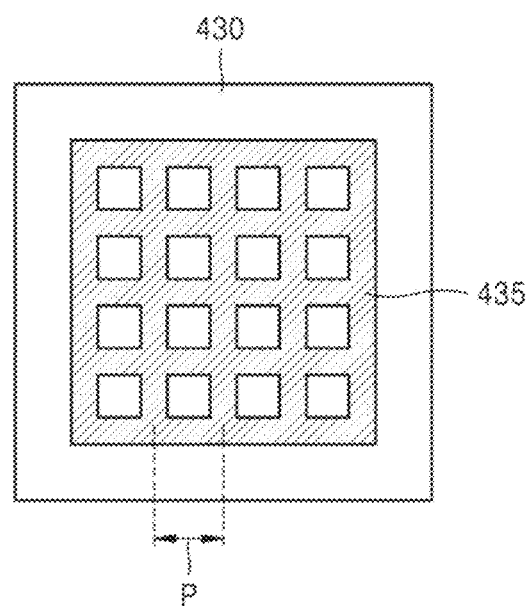

Referring to FIG. 10, an electrical contact 425 may include stripe patterns connected to a second electrode 420. A pitch P of the stripe patterns may be less than the width W of the micro-LED 230. Referring to FIG. 11, an electrical contact 435 may include grid patterns connected to a second electrode 430. A pitch P of the grid patterns may be less than the width W of the micro-LED 230.

Figure 12:
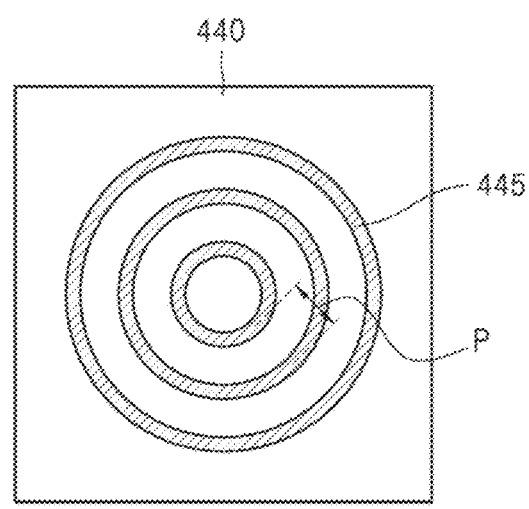

Referring to FIG. 12, an electrical contact 445 may include concentric circular patterns connected to a second electrode 440. A pitch P of the concentric circular patterns may be less than the width W of the micro-LED 230. The electrical contact 445 may be provided throughout a region in which the electrical contact 445 may cover all of the corresponding micro-LEDs 230.

The patterns of the electrical contacts 415 through 445 are described with reference to FIGS. 9 through 12. Because the electrical contact is defined by the via pattern, the patterns of the electrical contacts 415 through 445 described above may be similarly applied to the via patterns 238 and 238A (see FIGS. 3A and 3B).

Figure 13:
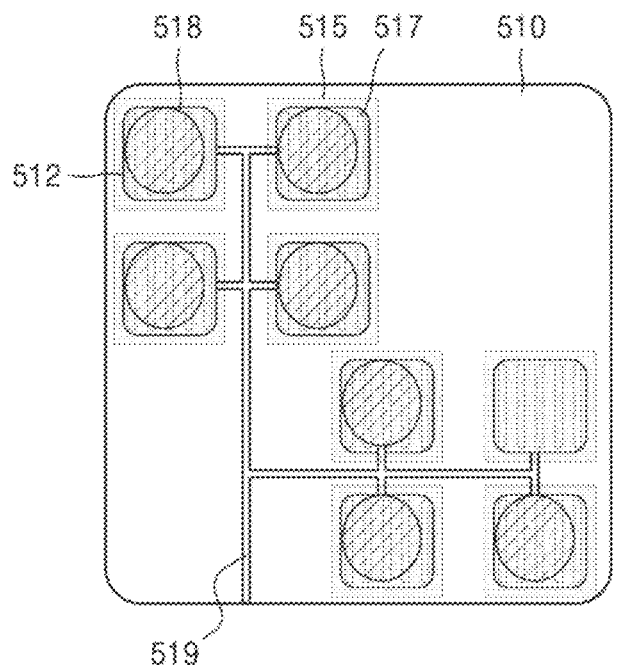
FIGS. 13, 14, and 15 are diagrams of examples of various layout structures of a micro-LED and an electrode of a micro-LED display apparatus according to example embodiments.
Figure 14:
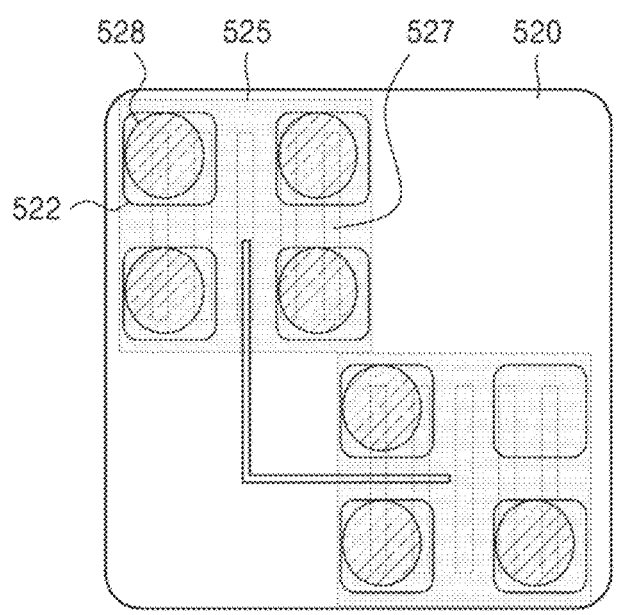
Figure 15:
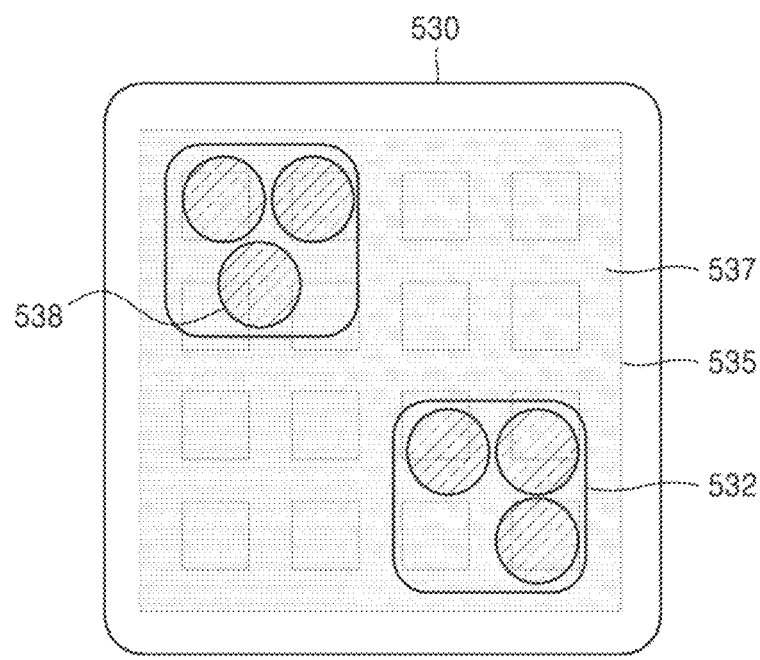

FIGS. 13 through 15 illustrate examples of various layout structures of first electrodes 512, 522, and 532 and second electrodes 515, 525, and 535.

Referring to FIG. 13, eight first electrodes 512 may be provided in a sub-pixel 510. One micro-LED 518 may be provided in each of the eight first electrodes 512, and one second electrode 515 may be provided to correspond to each of the eight first electrodes 512. Also, an electrical contact 517 connected between the second electrode 515 and the micro-LED 518 may be provided. An interconnection line 519 may be connected to each of the eight first electrodes 512. In FIG. 13, one micro-LED may not be provided, and the electrical contact 517 may be spaced apart from the first electrode 512 in a location in which the micro-LED is not provided. Thus, a short-circuit may be prevented.

Referring to FIG. 14, eight first electrodes 522 may be provided in a sub-pixel 520. One micro-LED 528 may be provided in each of the eight first electrodes 522, and one second electrode 525 may be provided to correspond to four first electrodes 522. Also, an electrical contact 527 connected between the second electrode 525 and the micro-LED 528 may be provided. For example, the electrical contact 527 may have stripe patterns. The electrical contacts 527 may be arranged to have a pitch that is less than a width of the micro-LEDs 528, and thus, even when the micro-LEDs 528 are irregularly arranged, the micro-LEDs 528 may be electrically connected to the second electrode 525 from any location. When a plurality of micro-LEDs are arranged in one sub-pixel, even when one or more micro-LEDs are not provided or defects occur to one or more micro-LEDs, a normal operation may become possible via other normal micro-LEDs. Thus, a repair operation may not be required.

Referring to FIG. 15, two first electrodes 532 may be provided in a sub-pixel 530. A plurality of micro-LEDs 538 may be provided in each of the two first electrodes 532, and one second electrode 535 may be provided to correspond to the two first electrodes 532. In this case, one second electrode 535 may be provided in the sub-pixel 530. Also, an electrical contact 537 connected between the second electrode 535 and the micro-LED 538 may be provided. For example, the electrical contact 537 may be provided in grid patterns.

As described above, the first electrode and the second electrode may have a 1-on-1 correspondence structure or an n-on-1 correspondence structure, where n is greater than 1.

Next, a method of manufacturing a micro-LED display apparatus will be described according to an example embodiment.

Figure 16:
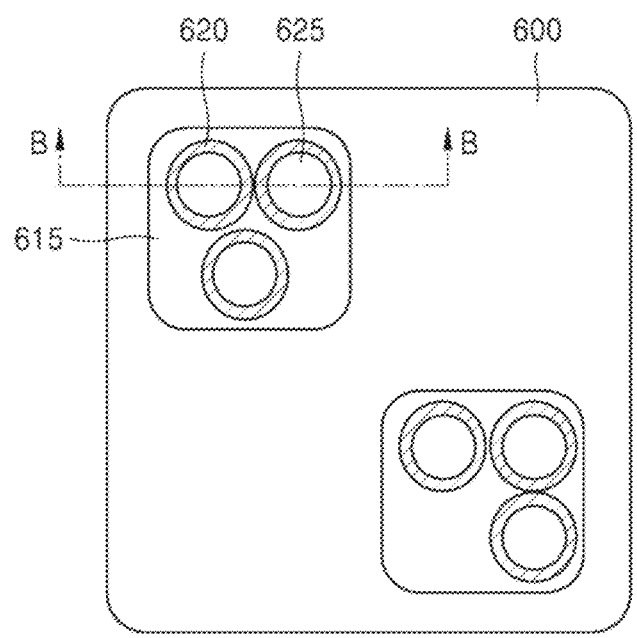
FIGS. 16, 17, 18, 19, 20, 21, 22, 23, 24, and 25 are views for describing a method of manufacturing a micro-LED display apparatus according to an embodiment.
Figure 17:
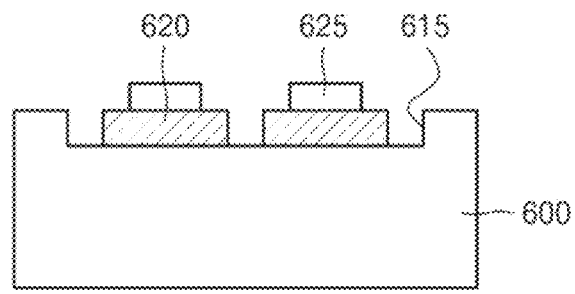

With respect to the method of manufacturing the micro-LED display apparatus, referring to FIG. 16, a transfer substrate 600 including a plurality of grooves 615 may be prepared. FIG. 16 illustrates one sub-pixel. FIG. 17 is a cross-sectional view of the sub-pixel of FIG. 16, taken along line B-B. The transfer substrate 600 may include a single layer or multiple layers. Each of the plurality of grooves 615 may be provided to include at least one micro-LED 620. The micro-LED 620 may be transferred onto the plurality of grooves 615. As a method of transferring the micro-LED 620, a dry transfer method or a wet transfer method may be used.

Figure 18:
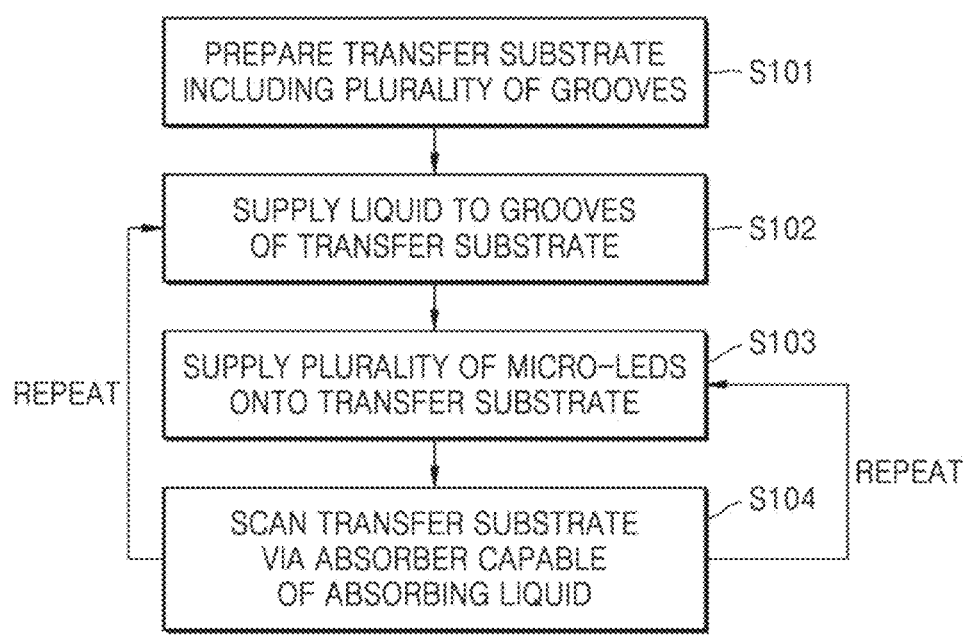

FIG. 18 illustrates an example flowchart of the wet transfer method. The wet transfer method may include preparing the transfer substrate 600 including the plurality of grooves 615 (S101), supplying a liquid to the plurality of grooves 615 of the transfer substrate 600 (S102), supplying the plurality of micro-LEDs 620 to the transfer substrate 600 (S103), and absorbing the liquid by scanning the transfer substrate 600 via an absorber capable of absorbing a liquid (S104).

The supplying of the liquid may include, for example, at least one of spraying, dispensing, inkjet dot spreading, and a method of spilling a liquid onto a transfer substrate. The liquid may include, for example, at least one from the group consisting of water, ethanol, alcohol, polyol, ketone, halocarbon, acetone, a flux, and a solvent. The scanning of the transfer substrate 600 via the absorber may include having the absorber contact and slide through the transfer substrate 600.

The plurality of micro-LEDs 620 may be directly spread on the transfer substrate 600 without the liquid or may be supplied to the transfer substrate 600 by using other materials than the liquid. Alternatively, other various methods may be used to transfer the micro-LEDs 620 to the transfer substrate 600. For example, the micro-LEDs 620 may be provided to the transfer substrate 600 while contained in a suspension. In this case, the supplying of the micro-LEDs 620 to the transfer substrate 600 may include various methods, such as spraying, dispensing, inkjet dot spreading, a method of spilling a suspension onto a transfer substrate, etc. The methods of supplying the micro-LEDs 620 to the transfer substrate 600 are not limited thereto and may be variously modified. The liquid may be supplied to the grooves 615 such that the amount of liquid properly fits the grooves 615 or such that the liquid spills over the grooves 615. The amount of liquid that is supplied may be variously modified.

The absorber for absorbing the liquid may include various types of materials capable of absorbing the liquid, and a shape or a structure of the absorber is not limited to particular types. The absorber may include, for example, fabric, a tissue, a polyester fiber, paper, a wiper, or the like. The absorber may be independently used without an auxiliary device or may be used along with an auxiliary device according to necessity.

An electrode pad 625 may be located on an upper surface of the micro-LED 620, the upper surface facing an opening of the grooves 615. At least one micro-LED 620 may be provided in the grooves 615. The micro-LEDs 620 may be irregularly arranged. The grooves 615 may have a greater size than the micro-LEDs 620. Depending on the size of the grooves 615, the number of micro-LEDs 620 transferred onto the grooves 615 may vary.

For example, the micro-LEDs 620 may have a size that is equal to or less than about 200 µm. Here, the size may indicate a maximum cross-sectional diameter of the micro-LED 620. Here, the cross-sectional direction may indicate a direction perpendicular to a direction in which light is emitted from the micro-LEDs 620. The micro-LEDs 620 may have cross-sections of various shapes, such as a triangular cross-section, a quadrangular cross-section, a circular cross-section, etc. Sizes of the grooves 615 may be determined, for example, according to the desired number of micro-LEDs 620. The grooves 615 may have various shapes. For example, the grooves 615 may have a triangular cross-section, a quadrangular cross-section, a circular cross-section, or the like. Two grooves 615 may be provided in one sub-pixel, and one micro-LED 620 may be provided in each groove 615. Alternatively, two grooves 615 may be provided in one sub-pixel, and a plurality of micro-LEDs 620 may be provided in each groove 615. Alternatively, one groove 615 may be provided in one sub-pixel, and a plurality of micro-LEDs 620 may be provided in the groove 615. Alternatively, eight grooves 615 may be provided in one sub-pixel, and one micro-LED 620 may be provided in each of the eight grooves 615. However, a number of the grooves 615 and the micro-LEDs 620 provided are not limited thereto, and embodiments may have various other arrangement structures. The micro-LEDs 620 may have, for example, a vertical electrode structure.

Figure 19:
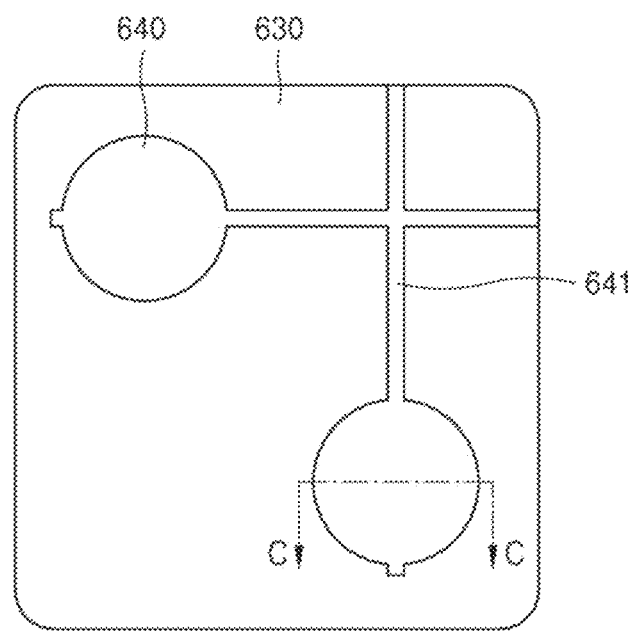
Figure 20:
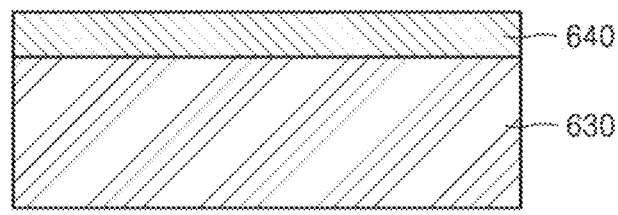

Referring to FIG. 19, a first electrode 640 may be formed on the driving circuit substrate 630. FIG. 20 is a cross-sectional view of the driving circuit substrate 630 of FIG. 19, taken along line C-C. The driving circuit substrate 630 may include, for example, at least one transistor and at least one capacitor. The at least one transistor may include, for example, a switching transistor and a driving transistor. The first electrode 640 may be provided to correspond to the groove 615 of the transfer substrate 600 illustrated in FIG. 16. However, the first electrode 640 is not limited thereto and may be variously modified. The first electrode 640 and another first electrode 640 may be connected to each other via an interconnect line 641. The first electrode 640 may have various shapes, such as a circular shape, a quadrangular shape, etc.

Figure 21:
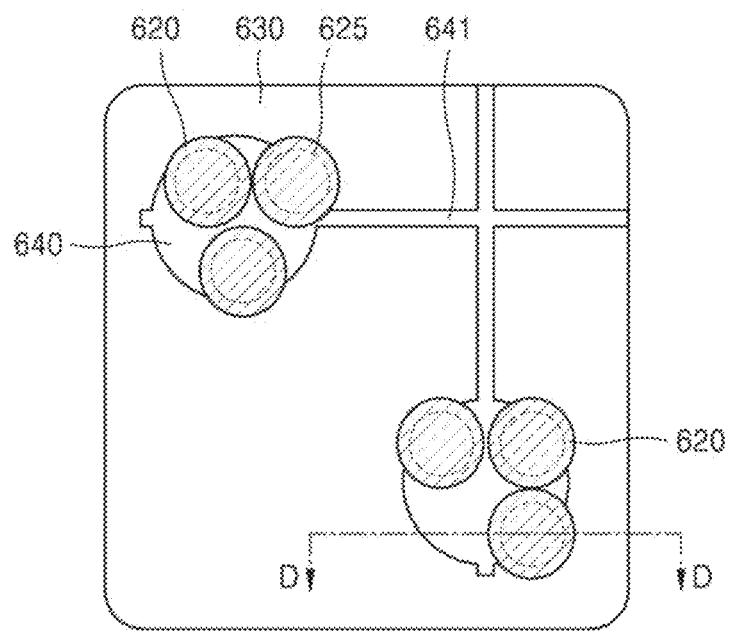

Referring to FIG. 21, the driving circuit substrate 630 illustrated in FIG. 19 may correspond to the transfer substrate 600 illustrated in FIG. 16, and thus, the micro-LED 620 may be transferred from the transfer substrate 600 to the driving circuit substrate 630 to contact the first electrode 640. The micro-LED 620 may be bonded to the first electrode 640.

Figure 22:
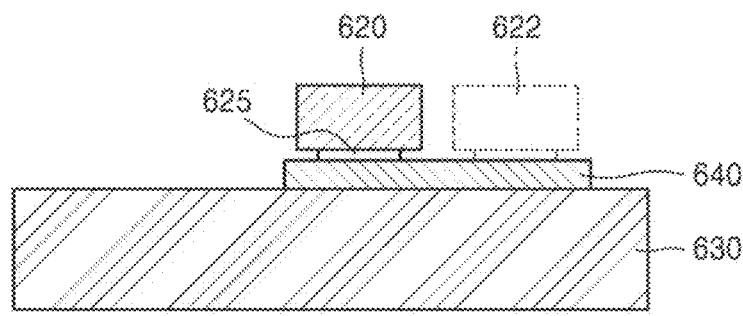

FIG. 22 is a cross-sectional view of FIG. 21, taken along line D-D. Referring to FIG. 22, the electrode pad 625 may be provided between the first electrode 640 and the micro-LED 620. FIG. 21 illustrates that three micro-LEDs 620 are arranged in one first electrode 640. However, the example of FIG. 21 illustrates that one of the four micro-LEDs 620 arranged in the first electrode 640 is not provided. In FIG. 22, a portion 622 indicates an area of the missing micro-LED. According to the example embodiment, a normal operation may be performed without a repair operation performed on the missing micro-LED.

Figure 23:
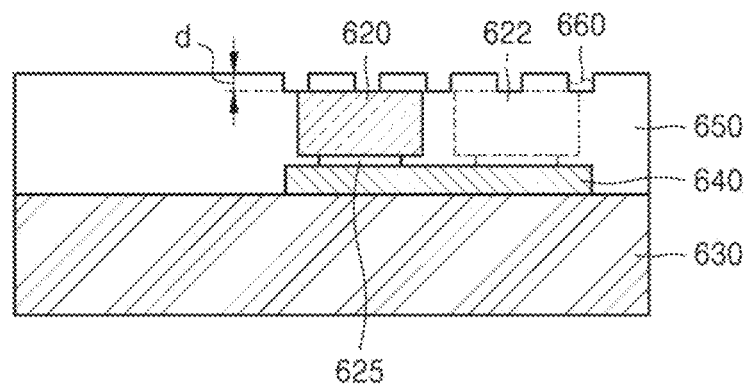

Referring to FIG. 23, an insulating layer 650 may be deposited on the driving circuit substrate 630. The insulating layer 650 may be provided to cover the micro-LED 620. The insulating layer 650 may have a greater thickness than the micro-LED 620. For example, a predetermined thickness between an upper surface of the insulating layer 650 and an upper surface of the micro-LED 620 may be defined. A via pattern 660 may be formed in the insulating layer 650. The via pattern 660 may have a depth d corresponding to a distance between the upper surface of the insulating layer 650 and the upper surface of the micro-LED 620. The via pattern 660 may have the depth d to expose the micro-LED 620. The depth d of the via pattern 660 may be selectively formed by adjusting an etch duration time or using a resolution and a critical dimension of a photosensitive material.

Figure 24:
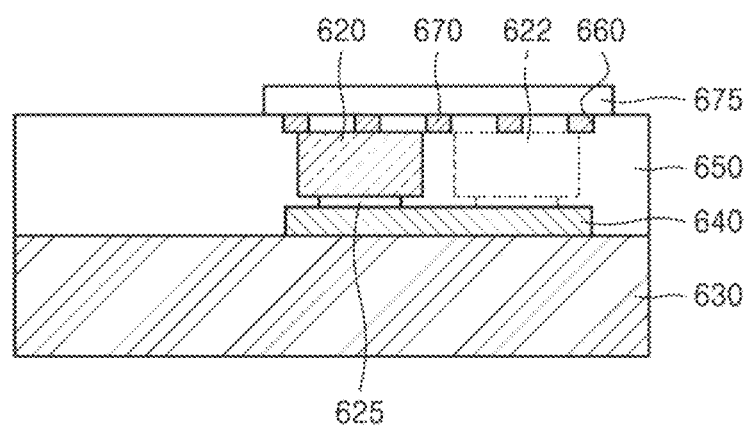

Referring to FIG. 24, electrical contacts 670 may be formed in the via pattern 660. The electrical contacts 670 may be defined by the via pattern 660. For example, the via pattern 660 may have various patterns, such as dotted patterns, stripe patterns, grid patterns, or concentric patterns. For example, the electrical contacts 670 may have various patterns, such as dotted patterns, stripe patterns, grid patterns, or concentric patterns. The electrical contacts 670 may have the thickness corresponding to the distance between the upper surface of the insulating layer 650 and the upper surface of the micro-LED 620. Also, the electrical contacts 670 may include the patterns having a pitch that is less than a width of the micro-LED 620, as described above with reference to FIGS. 9 through 12.

A second electrode 675 may be formed on the electrical contacts 670 and the insulating layer 650. The second electrode 675 may include, for example, a transparent electrode, such as indium tin oxide (ITO), indium zinc oxide (IZO), ITO/Ag/ITO, etc. When the electrical contacts 670 have the thickness and the pitch as described above, regardless of the location of the micro-LEDs 620, the electrical contacts 670 and the micro-LEDs 620 may be connected to each other, and a short-circuit may be prevented at a location of the missing micro-LED 622. Thus, malfunctioning may be prevented without a repair operation, and normal operations may become possible via the micro-LEDs 620 that are provided.

Figure 25:
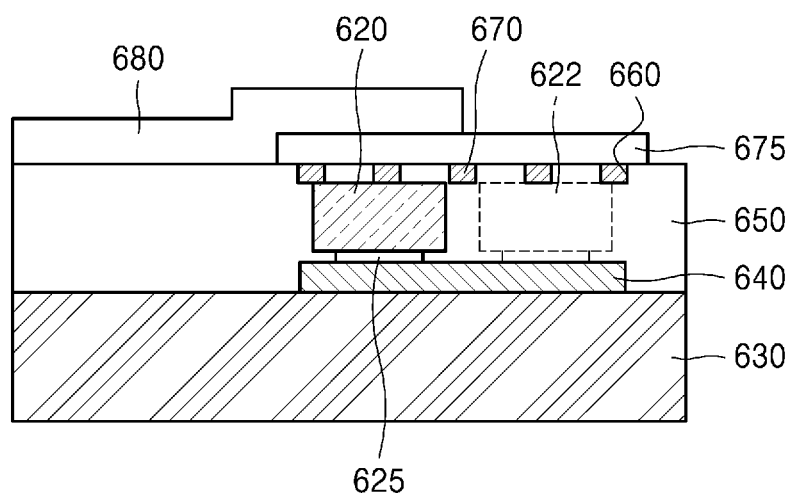

Referring to FIG. 25, an interconnect line 680 connected to the second electrode 675 may be formed.

According to the method of manufacturing the micro-LED display apparatus according to an example embodiment described above, a micro-LED may be transferred to a large area at high speed via a self-assembly method, and a plurality of micro-LEDs may be transferred to a sub-pixel, and thus, a defect rate may be reduced. Also, based on the selective via pattern structure, from a region in which the micro-LEDs are provided and a region in which the micro-LEDs are not provided, only the region including the micro-LEDs may be electrically connected. Based on the selective via pattern structure, process margins reflecting a short-circuit defect may be reduced, and thus, a degree of freedom of a region in which a first electrode and a second electrode overlap each other may be increased to increase align margins of a bonding process. Thus, even when the size of the micro-LEDs decreases, a process yield rate may be increased.

The micro-LED display apparatuses 100, 200, 200A according to example embodiments may be applied to various electronic devices, such as a micro-LED television (TV), an liquid crystal display apparatus, a mobile device, a vehicle display apparatus, augmented reality (AR) glasses, virtual reality (VR) glasses, etc.

Figure 26:
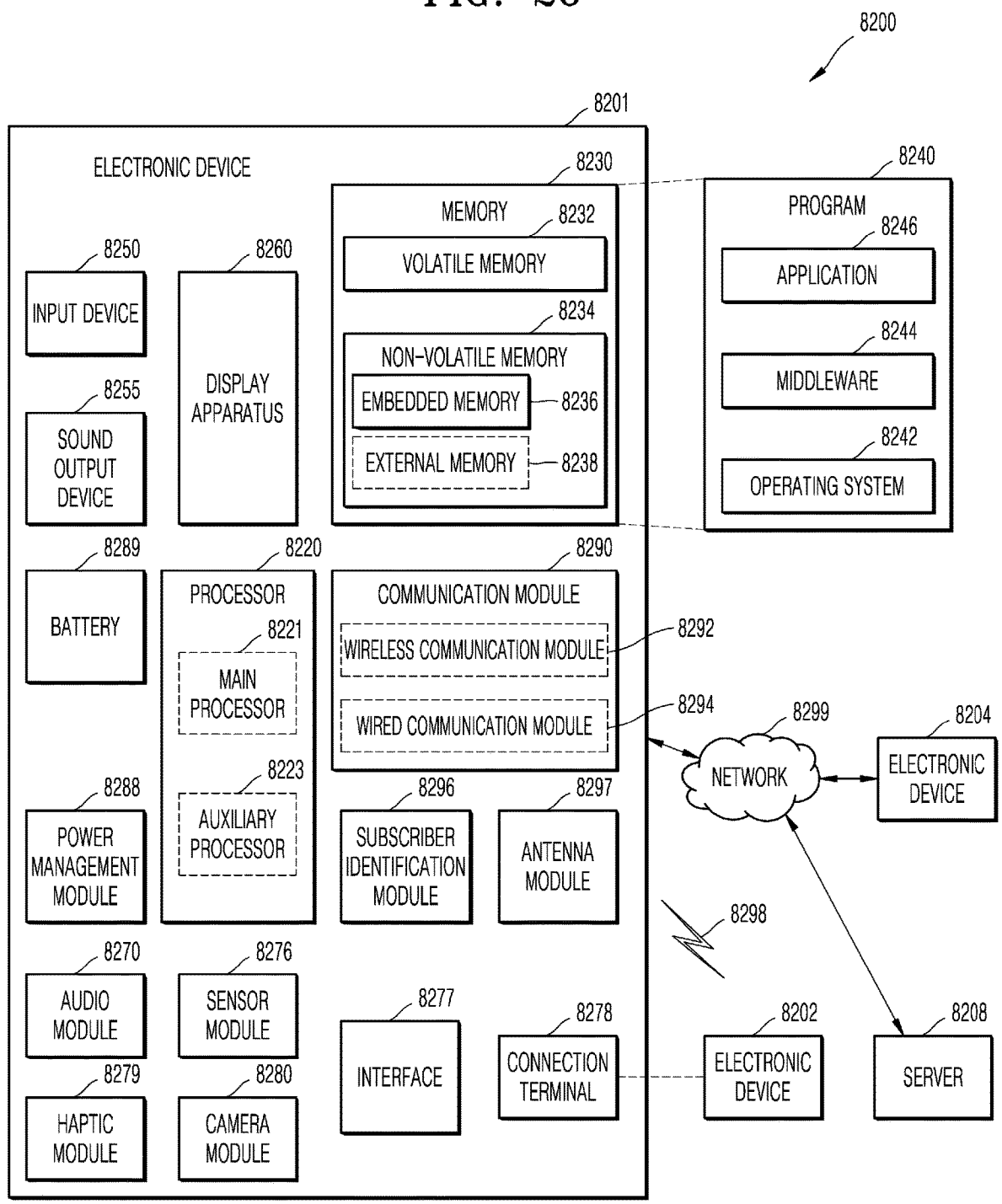
FIG. 26 is a schematic block diagram of an electronic device according to an example embodiment.

FIG. 26 is a block diagram of an electronic device 8201 including the micro-LED display apparatuses 100, 200, and 200A according to an example embodiment.

Referring to FIG. 26, the electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a remote wireless communication network, etc.). The electronic device 8201 may communicate with the electronic device 8204 through the server 8208. The electronic device 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. The electronic device 8201 may omit one or more of the components or may further include other components. One or more of the components may be realized as an integrated circuit. For example, the sensor module 8276 (a fingerprint sensor, an iris sensor, an illumination sensor, etc.) may be embedded in the display apparatus 8260 (a display, etc.).

The processor 8220 may be configured to execute software (a program 8240, etc.) to control one or more components (hardware or software components) of the electronic device 8201, the components being connected to the processor 8220, and to perform various data processing or calculations. As part of the data processing or calculations, the processor 8220 may be configured to load a command and/or data received from other components (the sensor module 8276, the communication module 8290, etc.) into the volatile memory 8232, process the command and/or the data stored in a volatile memory 8232, and store resultant data in a nonvolatile memory 8234. The processor 8220 may include a main processor 8221 (a central processing unit (CPU), an application processor (AP), etc.) and an auxiliary processor 8223 (a graphics processing unit (GPU), an image signal processor, a sensor hub processor, a communication processor, etc.) which may independently operate or operate with the main processor 8221. The auxiliary processor 8223 may use less power than the main processor 8221 and may perform specialized functions.

When the main processor 8221 is in an inactive state (a sleep state), the auxiliary processor 8223 may take charge of an operation of controlling functions and/or states related to one or more components (the display apparatus 8260, the sensor module 8276, the communication module 8290, etc.) from among the components of the electronic device 8201, or when the main processor 8221 is in an active state (an application execution state), the auxiliary processor 8223 may perform the same operation along with the main processor 8221. The auxiliary processor 8223 (the image signal processor, the communication processor, etc.) may be realized as part of other functionally-related components (the camera module 8280, the communication module 8290, etc.).

The memory 8230 may store various data required by the components (the processor 8220, the sensor module 8276, etc.) of the electronic device 8201. The data may include, for example, software (the program 8240, etc.), input data and/or output data of a command related to the software. The memory 8230 may include the volatile memory 8232 and/or the nonvolatile memory 8234. The nonvolatile memory 8234 may comprise an embedded memory 8236 and/or an external memory 8238.

The program 8240 may be stored in the memory 8230 as software, and may include an operating system 8242, middleware 8244, and/or an application 8246.

The input device 8250 may receive a command and/or data to be used by the components (the processor 8220, etc.) of the electronic device 8201 from the outside of the electronic device 8201. The input device 8250 may include a remote controller, a microphone, a mouse, a keyboard, and/or a digital pen (a stylus pen, etc.).

The sound output device 8255 may output a sound signal to the outside of the electronic device 8201. The sound output device 8255 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus 8260 may visually provide information to the outside of the electronic device 8201. The display apparatus 8260 may include a display, a hologram device, or a controlling circuit for controlling a projector and a corresponding device. The display apparatus 8260 may implement the micro-LED display apparatuses 100, 200, and 200A described with reference to FIGS. 1 through 25. The display apparatus 8260 may include touch circuitry configured to sense a touch operation and/or sensor circuitry (a pressure sensor, etc.) configured to measure an intensity of a force generated by the touch operation.

The audio module 8270 may convert sound into an electrical signal or an electrical signal into sound. The audio module 8270 may obtain sound via the input device 8250 or may output sound via the sound output device 8255 and/or a speaker and/or a headphone of an electronic device (the electronic device 8202, etc.) directly or wirelessly connected to the electronic device 8201.

The sensor module 8276 may sense an operation state (power, temperature, etc.) of the electronic device 8201 or an external environmental state (a user state, etc.) and generate electrical signals and/or data values corresponding to the sensed state. The sensor module 8276 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols to be used for the electronic device 8201 to be directly or wirelessly connected to another electronic device (the electronic device 8202, etc.). The interface 8277 may include a high-definition multimedia interface (HDMI) interface, a universal serial bus (USB) interface, an SD card interface, and/or an audio interface.

A connection terminal 8278 may include a connector, through which the electronic device 8201 may be physically connected to another electronic device (the electronic device 8202, etc.). The connection terminal 8278 may include an HDMI connector, a USB connector, an SD card connector, and/or an audio connector (a headphone connector, etc.).

An haptic module 8279 may convert an electrical signal into a mechanical stimulus (vibration, motion, etc.) or an electrical stimulus which is recognizable to a user via haptic or motion sensation. The haptic module 8279 may include a motor, a piezoelectric device, and/or an electrical stimulus device.

The camera module 8280 may capture a still image and a video. The camera module 8280 may include a lens assembly including one or more lenses, image sensors, image signal processors, and/or flashes. The lens assemblies included in the camera module 8280 may collect light emitted from an object, an image of which is to be captured.

The power management module 8288 may manage power supplied to the electronic device 8201. The power management module 8388 may be realized as part of a power management integrated circuit (PMIC).

The battery 8289 may supply power to the components of the electronic device 8201. The battery 8289 may include a non-rechargeable primary battery, rechargeable secondary battery, and/or a fuel battery.

The communication module 8290 may support establishment of direct (wired) communication channels and/or wireless communication channels between the electronic device 8201 and other electronic devices (the electronic device 8202, the electronic device 8204, the server 8208, etc.) and communication performance through the established communication channels. The communication module 8290 may include one or more communication processors separately operating from the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module), and/or a wired communication module 8294 (a local area network (LAN) communication module, a power line communication module, etc.). From these communication modules, a corresponding communication module may communicate with other electronic devices through a first network 8298 (a short-range wireless communication network, such as Bluetooth, Wifi direct, or infrared data association (IrDa)) or a second network 8299 (a remote communication network, such as a cellular network, the Internet, or a computer network (LAN, WAN, etc.)). Various types of communication modules described above may be integrated as a single component (a single chip, etc.) or realized as a plurality of components (a plurality of chips). The wireless communication module 8292 may identify and authenticate the electronic device 8201 within the first network 8298 and/or the second network 8299 by using subscriber information (international mobile subscriber identification (IMSI), etc.) stored in the subscriber identification module 8296.

The antenna module 8297 may transmit a signal and/or power to the outside (other electronic devices, etc.) or receive the same from the outside. The antenna may include an emitter including a conductive pattern formed on a substrate (a printed circuit board (PCB), etc.). The antenna module 8297 may include an antenna or a plurality of antennas. When the antenna module 8297 includes a plurality of antennas, an appropriate antenna which is suitable for a communication method used in the communication networks, such as the first network 8298 and/or the second network 8299, may be selected. Through the selected antenna, signals and/or power may be transmitted or received between the communication module 8290 and other electronic devices. In addition to the antenna, another component (a radio frequency integrated circuit (RFIC), etc.) may be included in the antenna module 8297.

One or more of the components of the electronic device 8201 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.).

The command or the data may be transmitted or received between the electronic device 8201 and another external electronic device 8204 through the server 8208 connected to the second network 8299. Other electronic devices 8202 and 8204 may be electronic devices that are homogeneous or heterogeneous types with respect to the electronic device 8201. All or part of operations performed in the electronic device 8201 may be performed by one or more of the other electronic devices 8202, 8204, and 8208. For example, when the electronic device 8201 has to perform a function or a service, instead of directly performing the function or the service, the one or more other electronic devices may be requested to perform part or all of the function or the service. The one or more other electronic devices receiving the request may perform an additional function or service related to the request and may transmit a result of the execution to the electronic device 8201. To this end, cloud computing, distribution computing, and/or client-server computing techniques may be used.

Figure 27:
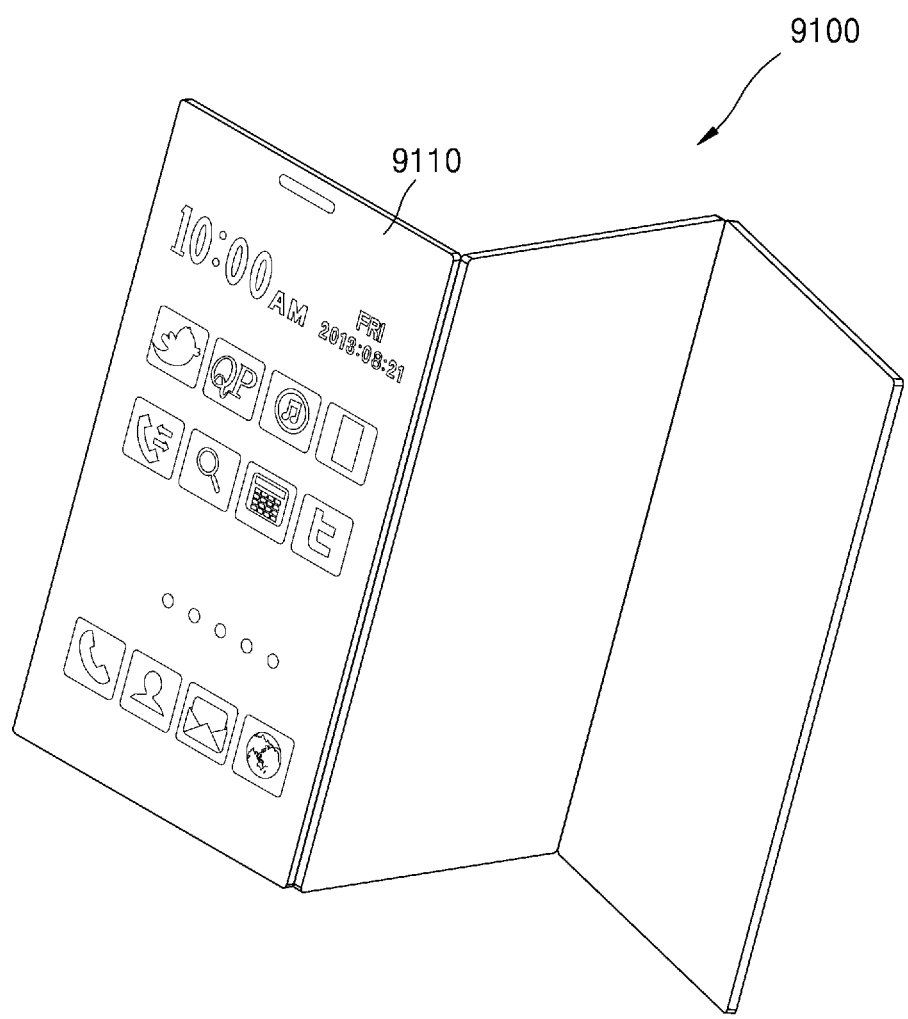
FIG. 27 illustrates an example in which a micro-LED display apparatus according to an example embodiment is applied to a mobile device.

FIG. 27 illustrates an example in which a micro-LED display apparatus according to an example embodiment is applied to a mobile device 9100. The mobile device 9100 may include a micro-LED display apparatus 9110 according to an example embodiment. The micro-LED display apparatus 9110 may include the micro-LED display apparatuses 100, 200, and 200A described with reference to FIGS. 1 through 25. The micro-LED display apparatus 9110 may have a foldable structure. For example, the micro-LED display apparatus 9110 may include a multi-foldable display apparatus. Here, the mobile device 9100 is illustrated as including a foldable micro-LED display apparatus. However, the mobile device 9100 may also include a flat display apparatus.

Figure 28:
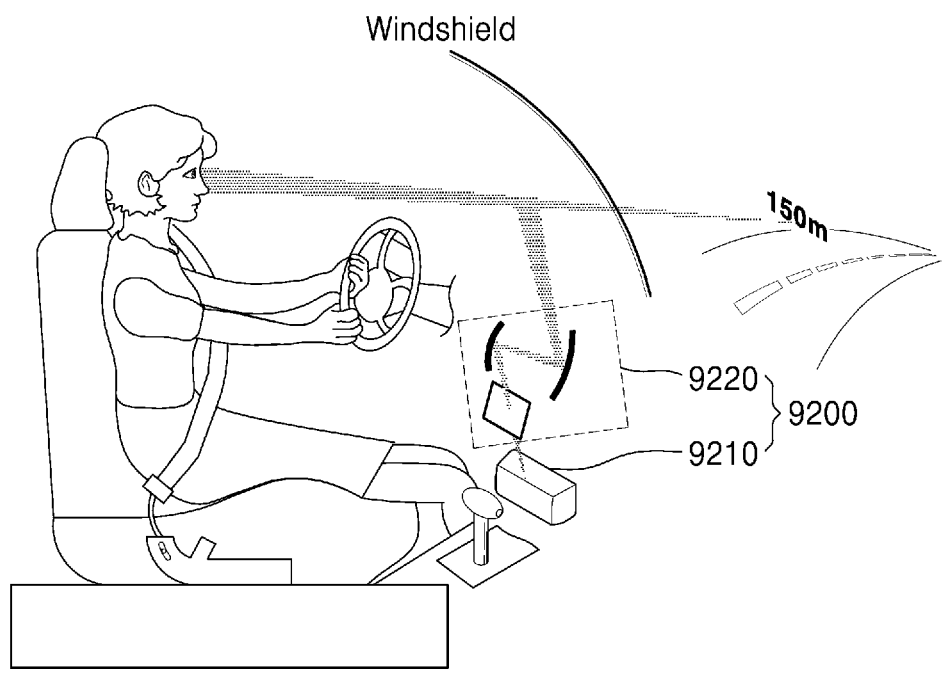
FIG. 28 illustrates an example in which a micro-LED display apparatus according to an example embodiment is applied to a vehicle display apparatus.

FIG. 28 illustrates an example in which a micro-LED display apparatus according to an example embodiment is applied to a vehicle. The micro-LED display apparatus may be applied to a vehicle head up display apparatus 9200. The vehicle head up display apparatus 9200 may include a display 9210 provided in a region of the vehicle and at least one optical path-change member 9220 configured to convert an optical path for a driver to watch an image generated by the display 9210.

Figure 29:
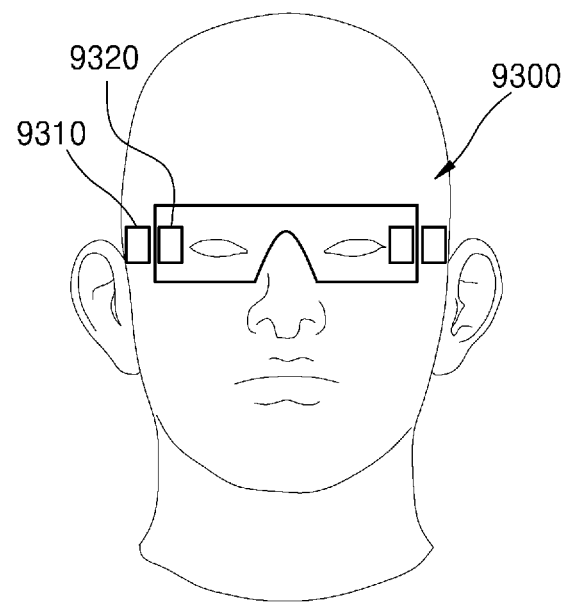
FIG. 29 illustrates an example in which a micro-LED display apparatus according to an example embodiment is applied to augmented reality (AR) glasses.

FIG. 29 illustrates an example in which a micro-LED display apparatus according to an example embodiment is applied to augmented reality (AR) glasses 9300 or virtual reality (VR) glasses. The AR glasses 9300 may include a projection system 9310 configured to form an image and at least one component 9320 configured to guide an image from the projection system 9310 to the eye of a user. The projection system 9310 may include the micro-LED display apparatuses 100, 200, and 200A described with reference to FIGS. 1 through 25.

Figure 30:
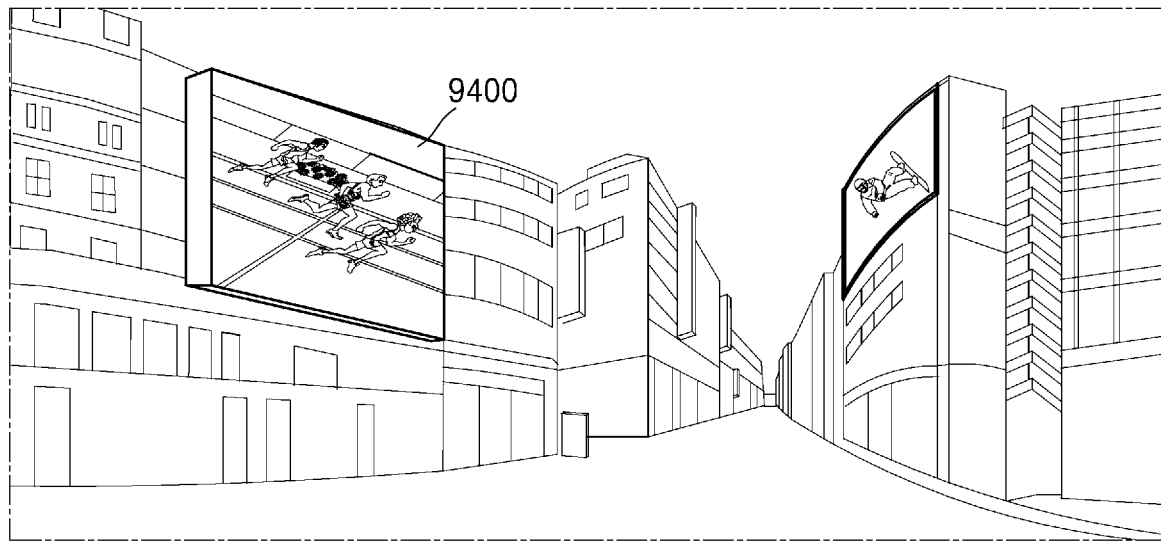
FIG. 30 illustrates an example in which a micro-LED display apparatus according to an example embodiment is applied to signage.

FIG. 30 illustrates an example in which a micro-LED display apparatus according to an example embodiment is applied to signage 9400. The signage 9400 may be used for outdoor advertising using digital information display and may control advertisement content through a communication network. The signage 9400 may be realized for example by the electronic device described with reference to FIG. 26.

Figure 31:
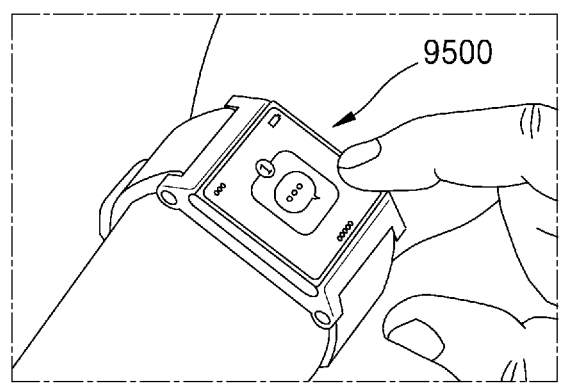
FIG. 31 illustrates an example in which a micro-LED display apparatus according to an example embodiment is applied to a wearable display.

FIG. 31 illustrates an example in which a micro-LED display apparatus according to an example embodiment, is applied to a wearable display 9500. The wearable display 9500 may include the display apparatuses described with reference to FIGS. 1 through 25 or may be realized by the electronic device 8201 described with reference to FIG. 26.

Also, the micro-LED display apparatuses 100, 200, and 200A according to an example embodiment may be applied to various devices, such as a rollable TV, a stretchable display, etc.

The micro-LED display apparatus according to an example embodiment may include a micro-LED and reduce a repair rate. The micro-LED display apparatus according to an example embodiment may include a plurality of micro-LEDs in one sub-pixel and, even when the micro-LEDs are irregularly arranged, may prevent electrical defects.

The method of manufacturing the micro-LED display apparatus according to an example embodiment may enable convenient manufacturing of the micro-LED display apparatus.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A micro-light-emitting diode (LED) display apparatus including a plurality of pixels, the micro-LED display apparatus comprising:
a driving circuit substrate;
a first electrode provided on the driving circuit substrate;
one or more micro-light-emitting diodes (LEDs) provided on the first electrode;
an insulating layer provided on the one or more micro-LEDs;
a via pattern provided in the insulating layer;
electrical contacts provided in the via pattern; and
a second electrode provided on the electrical contacts,
wherein the via pattern exposes a portion of the one or more micro-LEDs, and at least one of the electrical contacts provided in the via pattern is not in contact with any one of the one or more micro-LEDs, and
wherein the first electrode has an area size that accommodates at least two micro-LEDs.

2. The micro-light-emitting diode (LED) display apparatus of claim 1, wherein a thickness of the insulating layer is greater than a thickness of the one or more micro-LEDs.

3. The micro-light-emitting diode (LED) display apparatus of claim 1, wherein a thickness of each of the electrical contacts corresponds to a distance between an upper surface of the insulating layer and an upper surface of the one or more micro-LEDs.

4. The micro-light-emitting diode (LED) display apparatus of claim 1, wherein a pitch of the electrical contacts is less than a width of each of the one or more micro-LEDs.

5. The micro-light-emitting diode (LED) display apparatus of claim 1, wherein each of the plurality of pixels comprises a plurality of sub-pixels, and
wherein the via pattern is provided on each of the plurality of sub-pixels.

6. The micro-light-emitting diode (LED) display apparatus of claim 1, wherein each of the plurality of pixels comprises a plurality of sub-pixels, and wherein the one or more micro-LEDs are provided on each of the plurality of sub-pixels.

7. The micro-light-emitting diode (LED) display apparatus of claim 6, wherein the one or more micro-LEDs are arranged in each of the plurality of sub-pixels at an irregular interval.

8. The micro-light-emitting diode (LED) display apparatus of claim 1, wherein the one or more micro-LEDs are connected between the first electrode and the second electrode.

9. The micro-light-emitting diode (LED) display apparatus of claim 1, wherein the electrical contacts are provided in dotted patterns, stripe patterns, grid patterns, or concentric-circular patterns.

10. The micro-light-emitting diode (LED) display apparatus of claim 1, further comprising an electrode pad provided between the one or more micro-LEDs and the first electrode.

11. The micro-light-emitting diode (LED) display apparatus of claim 1, further comprising a color conversion layer provided on the second electrode, the color conversion layer being configured to convert a color of light emitted from the one or more micro-LEDs.

12. A method of manufacturing a micro-light emitting diode (LED) display apparatus including a plurality of pixels, the method comprising:
providing a first electrode on a driving circuit substrate;
providing one or more micro-light-emitting diodes (LEDs) to the driving circuit substrate such that the one or more micro-LEDs is electrically connected to the first electrode by an electrode pad;
providing an insulating layer on the one or more micro-LEDs;
providing, in the insulating layer, a via pattern exposing a portion of the one or more micro-LEDs;
providing electrical contacts in the via pattern; and
providing a second electrode on the electrical contacts and the insulating layer,
wherein the first electrode has an area size that accommodates at least two micro-LEDs.

13. The method of claim 12, wherein a thickness of the insulating layer is greater than a thickness of the one or more micro-LEDs.

14. The method of claim 12, wherein a thickness of each of the electrical contacts corresponds to a distance between an upper surface of the insulating layer and an upper surface of the one or more micro-LEDs.

15. The method of claim 12, wherein a pitch of the electrical contacts is less than a width of each of the one or more micro-LEDs.

16. The method of claim 12, wherein each of the plurality of pixels comprises a plurality of sub-pixels, and wherein the via pattern is provided on each of the plurality of sub-pixels.

17. The method of claim 12, wherein each of the plurality of pixels comprises a plurality of sub-pixels, and
wherein the one or more micro-LEDs are provided on each of the plurality of sub-pixels.

18. The method of claim 17, wherein the one or more micro-LEDs are irregularly provided.

19. The method of claim 12, wherein the one or more micro-LEDs are connected between the first electrode and the second electrode.

20. The method of claim 12, wherein the electrical contacts are provided in dotted patterns, stripe patterns, grid patterns, or concentric-circular patterns.

21. The method of claim 12, wherein a depth of the via pattern is selectively adjusted based on adjusting an etch duration time or based on a resolution and a critical dimension of a photosensitive material.

22. A micro-light-emitting diode (LED) display apparatus including a plurality of pixels, the micro-LED display apparatus comprising:

a driving circuit substrate;
a first electrode provided on the driving circuit substrate;
one or more micro-light-emitting diodes (LEDs) provided on the first electrode;
an insulating layer provided on the one or more micro-LEDs;
a via pattern provided in the insulating layer;
electrical contacts provided in the via pattern; and
a second electrode provided on the electrical contacts,
wherein the electrical contacts are spaced apart from the first electrode, and
wherein a thickness of each of the electrical contacts corresponds to a distance between an upper surface of the insulating layer and an upper surface of the one or more micro-LEDs,
wherein at least one of the electrical contacts provided in the via pattern is not in contact with any one of the one or more micro-LEDs, and
wherein the first electrode has an area size that accommodates at least two LEDs.

\* \* \* \* \*